United States Patent
Woo et al.

[11] Patent Number: 6,021,076
[45] Date of Patent: Feb. 1, 2000

[54] APPARATUS AND METHOD FOR THERMAL REGULATION IN MEMORY SUBSYSTEMS

[75] Inventors: Steven C. Woo, Saratoga; Ramprasad Satagopan, San Jose; Richard M. Barth, Palo Alto; Ely K. Tsern, Los Altos; Craig E. Hampel, San Jose, all of Calif.

[73] Assignee: Rambus Inc, MoutainView, Calif.

[21] Appl. No.: 09/118,696

[22] Filed: Jul. 16, 1998

[51] Int. Cl.[7] ............................................. G11C 7/04
[52] U.S. Cl. ............................................. 365/211; 365/212
[58] Field of Search .................................. 365/211, 212; 327/512, 513

[56] References Cited

U.S. PATENT DOCUMENTS

| | | | |
|---|---|---|---|
| 4,716,551 | 12/1987 | Inagaki | 365/212 |
| 5,278,796 | 1/1994 | Tillinghast et al. | 365/211 |
| 5,285,418 | 2/1994 | Yamaguchi | 365/211 |
| 5,293,381 | 3/1994 | Choy | 370/476 |
| 5,373,227 | 12/1994 | Keeth | 323/313 |
| 5,392,236 | 2/1995 | Hashimoto | 365/185 |
| 5,440,520 | 8/1995 | Schutz et al. | 365/211 |
| 5,446,696 | 8/1995 | Ware et al. | 365/212 |
| 5,451,892 | 9/1995 | Bailey | 327/113 |
| 5,598,395 | 1/1997 | Watanabe | 369/116 |
| 5,715,201 | 2/1998 | Khieu | 365/191 |
| 5,805,517 | 9/1998 | Pon | 365/212 |
| 5,875,142 | 2/1999 | Chevallier | 365/212 |

*Primary Examiner*—David Nelms
*Assistant Examiner*—Gene N. Auduong
*Attorney, Agent, or Firm*—Stepehen R. Whitt

[57] ABSTRACT

A memory system configured to provide thermal regulation of a plurality of memory devices is disclosed. The memory system comprises a memory device coupled to a bus. Additionally, the memory system also comprises a controller coupled to the bus. The controller determines an operating temperature of the memory device. Based on the operating temperature of the memory device, the controller is further operable to manipulate the operation of the memory system.

20 Claims, 9 Drawing Sheets

APPARATUS AND METHOD FOR THERMAL REGULATION IN MEMORY SUBSYSTEMS

FIELD OF THE INVENTION

The present invention relates to thermal regulation of a memory system. More particularly, the present invention relates to an apparatus and method used to control the operation of a memory system, thus regulating the operating temperature of the memory system.

BACKGROUND OF THE INVENTION

Improvements in microprocessor designs have led to microprocessors with a high operating frequency. Current microprocessor designs have operating frequencies of 400 megahertz ("MHz") and higher. The increase in operating frequency, however, has not led to fully acceptable performance gains. One of the main components affecting performance gains is created by the microprocessor execution units idling during delays in external memory access. The delays in external memory access are caused by the conventional design characteristics of static random access memory ("SRAM") cells, read only memory ("ROM") cells, and dynamic random access memory ("DRAM") cells.

To counteract the performance losses associated with external memory access, Rambus Inc., of Mountain View, Calif., developed a high speed memory system. FIG. 1 illustrates the Rambus high speed memory system. In particular, system 100 shows a master device, memory controller ("MC") 10, coupled to memory devices DRAM 20, SRAM 30, and ROM 40. Each device is coupled in parallel to signal lines DATA BUS, ADDR BUS, CLOCK, $V_{REF}$, GND, and VDD. DATA BUS and ADDR BUS show the data and address lines used by MC 10 to access data from the memory devices. CLOCK, $V_{REF}$, GND, and VDD are the clock, voltage reference, ground, and power signals shared between the multiple devices. Data is transferred by a single device's bus drivers (not shown) driving signals on the bus. The signals are transmitted across the bus to a destination device (not shown). For one embodiment, system 100 is coupled to a central processing unit ("CPU") (not shown). Accordingly, MC 10 coordinates the data transfer between the memory devices of system 100 and the CPU.

To increase the speed of external memory accesses, system 100 supports large data block transfers between the input/output ("I/O") pins of the destination device and the memory devices of system 100. System 100 also includes design requirements that constrain the length of the transmission bus, the pitch between the bus lines, and the capacitive loading on the bus lines. Using these design requirements system 100 operates at a higher frequency than conventional memory systems. Accordingly, by increasing operating frequency the performance of system 100 increases, thus reducing the idle time of the destination device coupled to system 100.

Although a high operating frequency increases the data throughput of system 100, operating system 100 at a high frequency typically results in higher power dissipation and higher system temperature. In particular, memory devices are designed to follow a set of design specifications. Typically the specifications require that the memory devices operate below a given junction temperature ("$Tj_{max}$"). Additionally, provided the memory devices include a dynamic cell design, the specification also includes a periodic refresh rate. The refresh rate ensures that the storage cells of the dynamic device are periodically recharged. Increasing the operating frequency of a memory system, however, results in the memory devices of the memory system generating high power levels. The high power levels translate to an increase in the operating temperature of the memory devices. If the operating temperature of a memory device surpasses $Tj_{max}$ the memory device may fail, thus resulting in the failure of the memory system.

To ensure lower operating temperatures, prior art memory systems implemented conventional thermal management techniques. In particular, to reduce the operating temperature of a memory device, prior art memory systems typically used specific packaging designs and specified the location of memory devices in memory systems. Conventional thermal management techniques, however, create numerous disadvantages.

One disadvantage of applying conventional thermal management results from the packaging designs of memory devices. In particular, conventional packaging designs are not always effective for dissipating power generated by devices operating at frequencies in excess of 100 Mhz, thus resulting in greater thermal dissipation requirements than prior art memory systems. Accordingly, the application of traditional packaging designs to reduce thermal dissipation prove ineffective in the thermal regulation of system 100.

Another disadvantage of applying conventional thermal management techniques is that conventional techniques place a constraint on the design layout of memory systems. In particular, conventional thermal management techniques require large distances between components to reduce heat transfer. In system 100, however, the devices are located in close proximity to each other in order to increase data throughput. Accordingly, the application of conventional placement techniques to reduce thermal dissipation prove ineffective in the thermal regulation of system 100.

SUMMARY OF THE INVENTION

It is an object of the present invention to provide thermal regulation in memory subsystems.

This and other objects are met by a memory system configured to provide thermal regulation of a plurality of memory devices. The memory system comprises a memory device coupled to a bus. The memory device is operable to store data available on the bus. The memory device is also operable to write data onto the bus. Additionally, the memory system also comprises a controller coupled to the bus. The controller is operable to transfer data on the bus. The controller also determines an operating temperature of the memory device. Based on the operating temperature of the memory device, the controller is further operable to manipulate the operation of the memory system.

Other objects, features, and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

Figure 1:
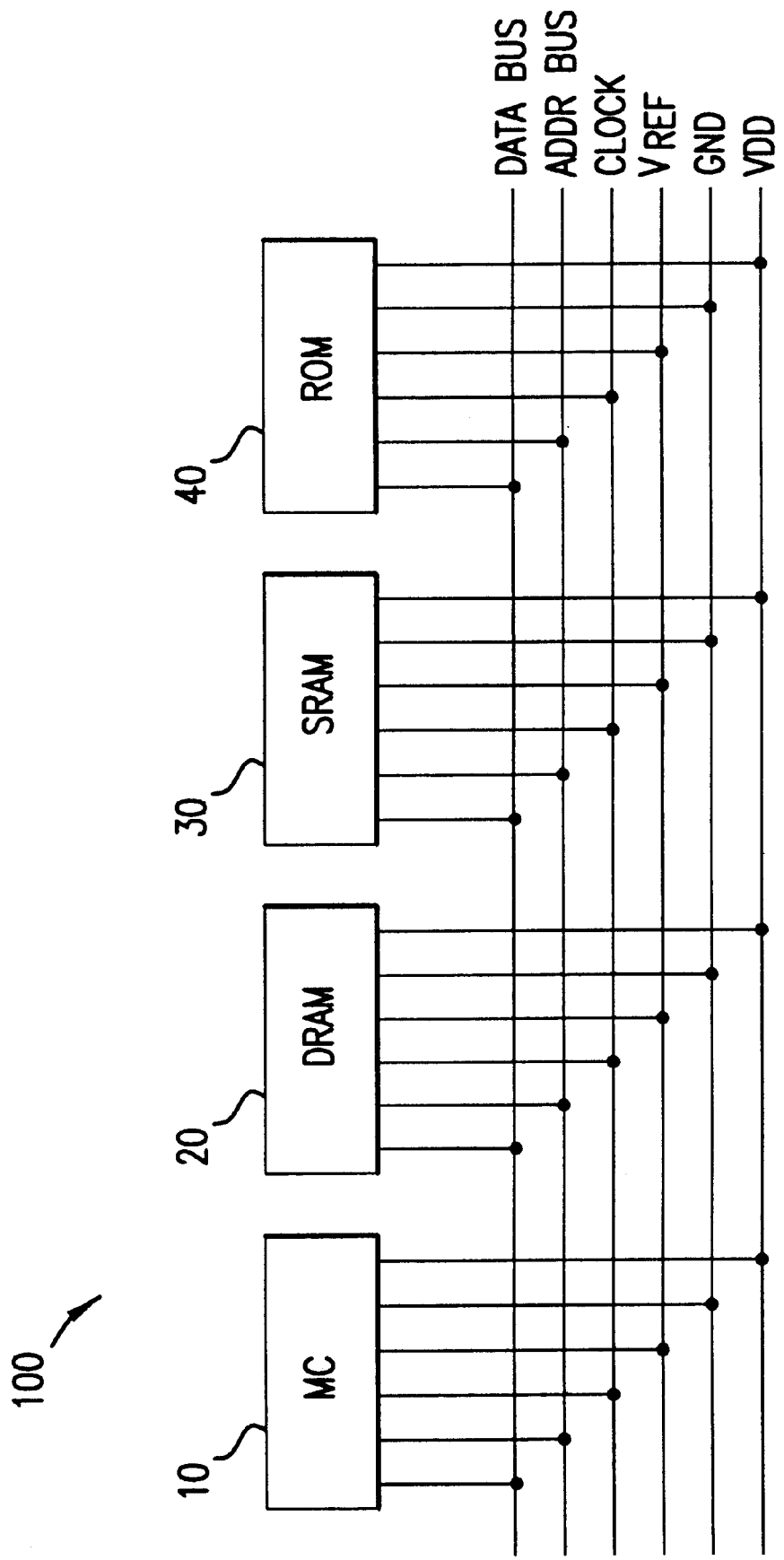
FIG. 1 illustrates a prior art memory system.

A memory system including a method for thermal regulation is disclosed. The memory system includes a memory controller and a memory device. For one embodiment, the memory device is designed to operate below a specific junction temperature ("$Tj_{,max}$"). The method sets forth steps to estimate the temperature of the memory device. If the operating temperature of the memory device is above a threshold value, the method regulates the operation of the memory system, thus regulating the temperature of the memory device. For an alternative embodiment, the memory system includes multiple memory devices. Accordingly, the method sets forth steps to estimate the temperature of each memory device. If one or more of the memory devices is operating above a threshold value, the method regulates the operation of the memory system, thus regulating the temperature of the memory devices operating above the threshold value.

For one embodiment, the memory device is a dynamic random access memories ("DRAM") and $Tj_{,max}$ equals one hundred degrees (100° C.). The method ensures that the DRAM is operating below one hundred degrees. For an alternative embodiment, the method allows the memory device to operate at a temperature higher than $Tj_{,max}$. The method, however, increases the refresh rate of the memory device to ensure that the memory devices will not fail at these higher temperatures.

A memory system including an apparatus to maintain thermal regulation is also disclosed. For one embodiment, the apparatus is included in a memory controller and the apparatus estimates the temperature of a memory device. To estimate the operating temperature of the memory device, the apparatus tracks the activity of the memory system. In particular, the apparatus stores the number of read/write cycles as well as the number of other relevant DRAM operations (like refresh operations) occurring in the memory device. Based on the number and types of operations in a given time period, the apparatus estimates the operating temperature of the memory device. If the operating temperature of the memory device exceeds a threshold value, the apparatus regulates the operation of the memory system. For an alternative embodiment, the memory device includes a temperature sensor that is coupled to the apparatus. The temperature sensor is used to reflect the actual temperature of the memory device. If the temperature sensor indicates that the memory device is operating above a given threshold temperature, the apparatus regulates the operation of the memory system. For another embodiment, the memory system includes multiple memory devices. The apparatus tracks the temperature of each of the memory devices. If one or more of the memory devices is operating above a threshold value, the apparatus regulates the operation of the memory system, thus regulating the temperature of the one or more memory devices operating above the threshold value.

As previously described, regulating the operation of the memory system results in regulating the operating temperature of the memory devices included in the memory system. A number of regulation schemes are possible. For example, for one embodiment, the regulation scheme consists of increasing the refresh rate of the memory system. For an alternative embodiment, regulating the operation of the memory system consists of dynamically changing the timing parameters of the memory system. For another embodiment, regulating the operation of the memory system consists of dynamically placing the components of the memory system in a low power mode. For yet another embodiment, regulating the operation of the memory system consists of dynamically enabling a cooling system.

Thermal regulation creates a number of advantages in high frequency memory systems. For example, an intended advantage of an embodiment of the invention is to provide high speed communication between a processor and a memory system. For one embodiment, the high speed communication is facilitated by operating the memory system at a high frequency.

Another intended advantage of an embodiment of the invention is to provide an apparatus that regulates the operation of a memory system. The apparatus regulates the memory system based on the operating temperature of the components of the memory system. For one embodiment, the apparatus uses a temperature sensor to determine the operating temperature of a memory device included in the memory system. For an alternative embodiment, the apparatus estimates the temperature of the memory device based on the number and type of operations performed by the memory device.

Figure 2A:
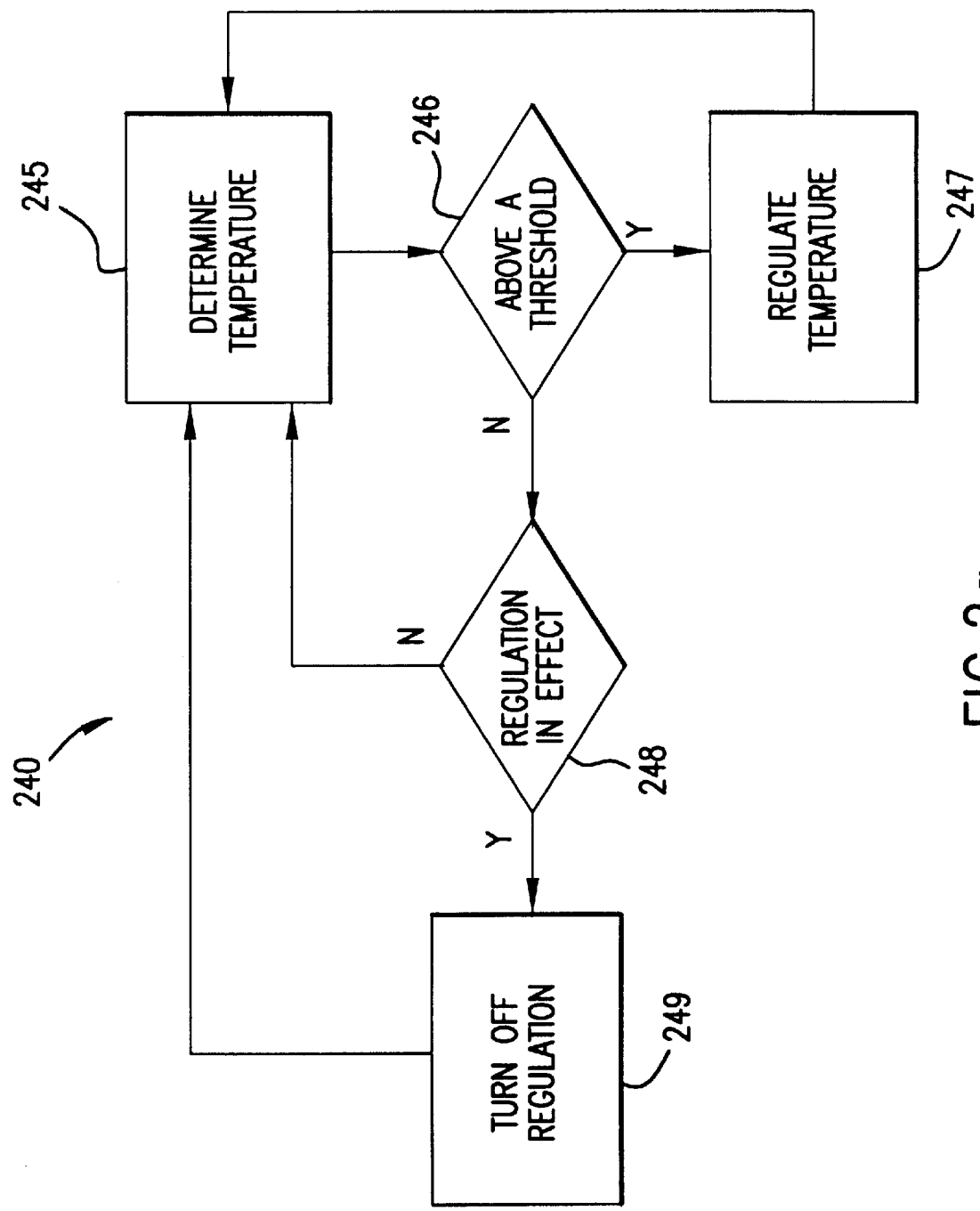
FIG. 2a shows one embodiment of a high level flowchart for implementing thermal regulation.

FIG. 2a shows one embodiment of a high level flowchart for implementing thermal regulation. In particular, flowchart 240 illustrates the steps used to turn off or turn on a thermal regulation scheme. In step 245, a memory system determines the operating temperature of a memory device. The actual method and circuitry for determining the temperature of the memory device are described below.

Step 246 follows the completion of step 245. In step 246, the operating temperature of the memory device is compared against a predetermined threshold value. If the operational temperature exceeds the threshold value, then step 247 is begun. In step 247, the memory system initiates a thermal regulation scheme. After step 247 is completed, the memory system returns to step 245. If the comparison done in step 246 finds that the operational temperature does not exceed the threshold value, however, then step 248 is begun.

In step 248, the memory system determines whether a thermal regulation scheme is active. If a thermal regulation scheme is not active, then the next step is step 245. If during step 248 the system determines that a thermal regulation scheme is active, then the memory system moves to step 249 in which the memory system turns off the regulation scheme because the memory device is operating below the threshold value. After step 249, the system returns to step 245. For one embodiment, a memory system including thermal regulation circuitry and one or more memory devices follow the steps in flowchart 240 to regulate the operating temperature of the memory devices.

Figure 2B:
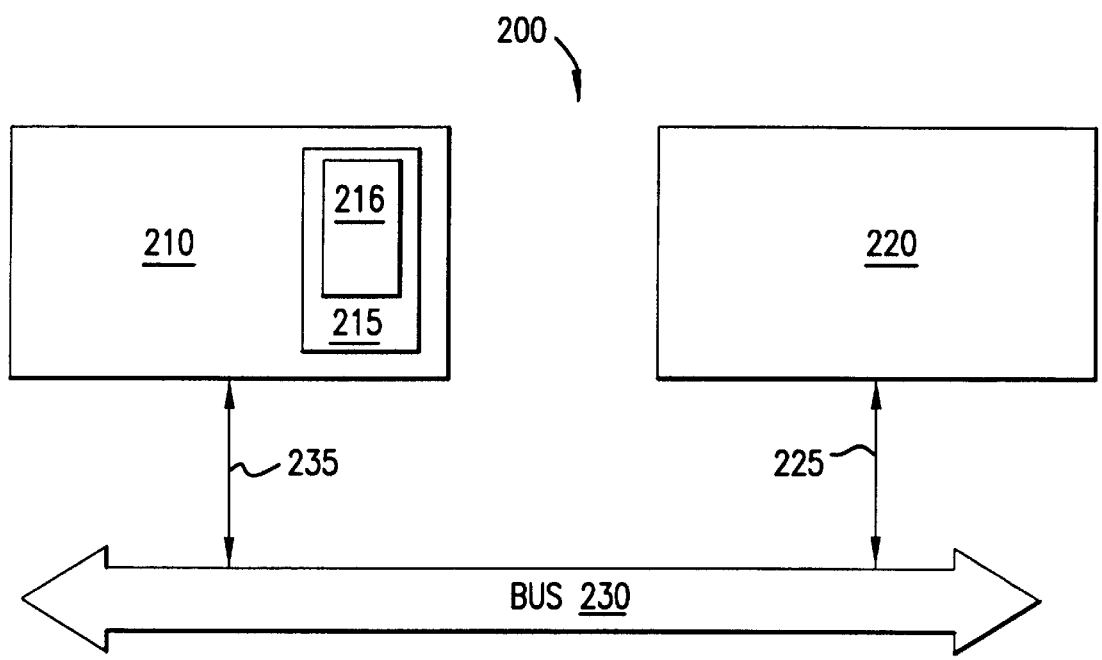
FIG. 2b shows one embodiment of a memory device coupled to a memory controller with thermal regulation circuitry.

FIG. 2b shows one embodiment of a memory device coupled to a memory controller with thermal regulation circuitry. In particular, system 200 includes controller 210 coupled to bus 230 along line 235. Bus 230, in turn, is coupled to memory device 220 via line 225. For one embodiment, bus 230 transmits address and data between controller 210 and memory device 220. Accordingly, using bus 230, controller 210 reads/writes data directly from memory device 220. Using bus 230, controller 210 also transfers data from memory device 220 to a second device (not shown) coupled to bus 230.

As illustrated in FIG. 2b, controller 210 also includes circuit 215 and circuit 216. Circuit 215 is used to ensure that memory device 220 does not operate at a temperature exceeding $Tj_{,max}$. For one embodiment, circuit 216 is used to track the operations of memory device 220 over a given time period. Additionally, empirical data regarding the amount of energy/heat expended by memory device 220 is collected. Accordingly, circuit 215 uses the data stored in circuit 216 in conjunction with the empirical data to estimate the operational temperature of memory device 220 during the given time period. Provided the estimated temperature exceeds a threshold value, a regulation scheme is used to throttle the operation of system 200, thus reducing the temperature of memory device 220.

For one embodiment, circuit 216 is a memory block used to store the number and types of operations performed by memory device 220. For an alternative embodiment, circuit 216 is a first-in first-out ("FIFO") buffer with each stage of the FIFO buffer including multiple counters.

Figure 2C:
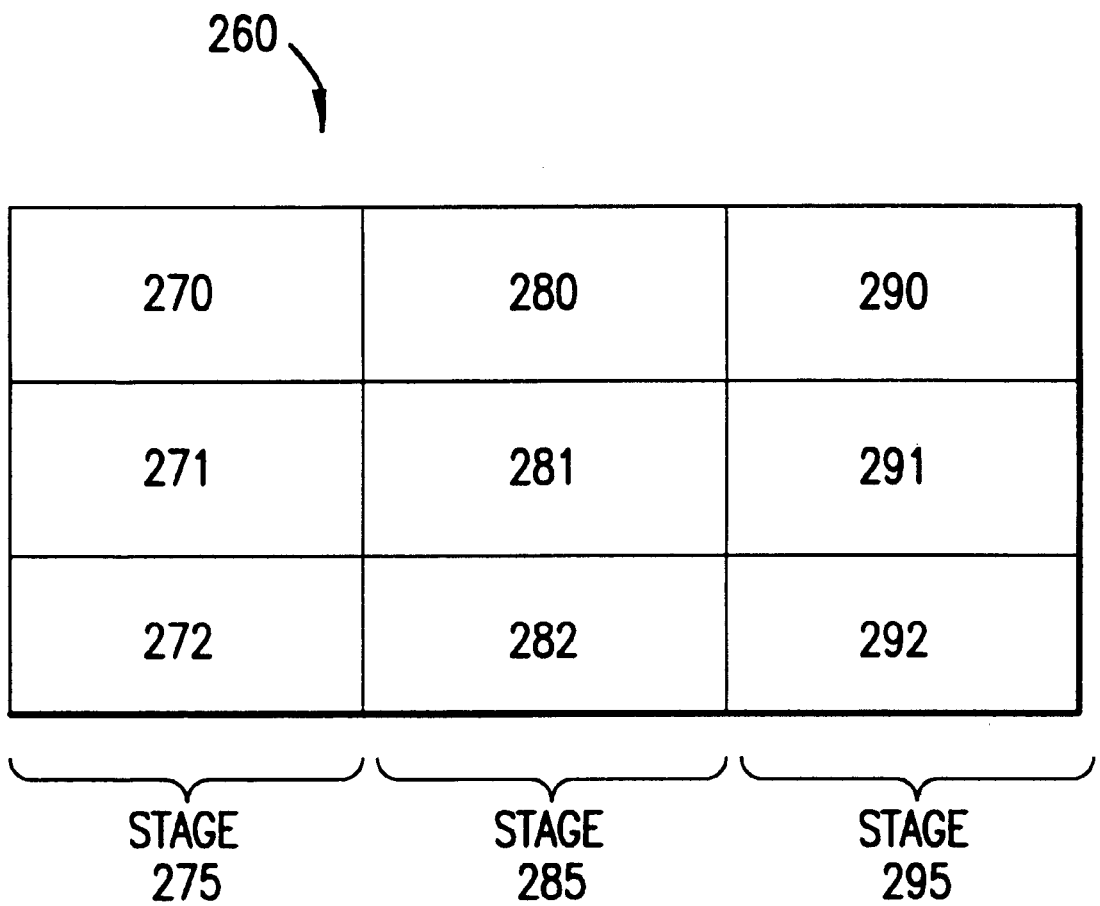
FIG. 2c illustrates one embodiment of a FIFO buffer.

FIG. 2c illustrates one embodiment of the FIFO buffer. In particular, FIFO buffer 260 includes three stages (275, 285, and 295) with each stage including a set of counters. Stage 275 includes counters 270–272. Stage 285 includes counters 280–282 and stage 295 includes counters 290–292. Each set of counters tracks the number of times a specific operation is performed by memory device 220 in a given time period "t1." Thus, each stage in FIFO buffer 260 denotes the number of times three specific operations are performed by memory device 220 during a "t1" time period. The number of stages of the FIFO buffer determines the extent of time during which the operations of memory device 220 are tracked.

For example, for one embodiment, the FIFO has five stages and t1 equals 1 second. Depending on the environment, first order calculations indicate that several million operations occurring in a few seconds can equate to a memory device 220 having a temperature of 95 degrees. Circuit 215 uses the five entries to calculate the activity of memory device 220 over this time period. In particular, based on the counter values of the FIFO buffer and empirically determined power values for each type of operation, circuit 216 calculates the total power dissipated by memory device 220. Empirical data is used to correlate the total power to the temperature of memory device 220. If the circuit 216 calculation is below a predetermined threshold value system 200 operates normally. If the circuit 216 calculation is above a predetermined threshold value, then controller 210 selects a regulation scheme to throttle the operation of system 200, thus controlling the operational temperature of memory device 220. For an alternative embodiment, memory system 200 includes multiple memory devices. Accordingly, multiple circuit 215s, each governing an individual memory device, are included in controller 210. The multiple circuit 215s allow controller 210 to estimate the temperature of each memory device and subsequently regulate the operation of memory system 200. For yet another embodiment, different predetermined values indicate different trip points. The multiple trip points allow system 200 to initiate a different regulation scheme for each trip point. Accordingly, system 200 performs graduated steps to reduce the operating temperature of memory device 220. The graduated steps allow system 200 to balance temperature control versus system performance.

System 200 incorporates a variety of regulation schemes to ensure that memory device 220 operates below $Tj_{,max}$. For one embodiment, to ensure that memory device 220 operates below $Tj_{,max}$, system 200 can increase the timing parameters of memory device 220—i.e., change the time required for memory device 220 to perform specific operations. For an alternative embodiment, to ensure that memory device 220 operates below $Tj_{,max}$, controller 210 introduces delays into the instruction sequence of memory device 220. In particular, if circuit 216 indicates a count value above a given threshold, controller 210 delays the execution of instructions relayed to memory device 220. For another embodiment, to ensure that memory device 220 operates below $Tj_{,max}$, controller 210 can change the operation mode of memory device 220 or activate a cooling system.

Figure 3:
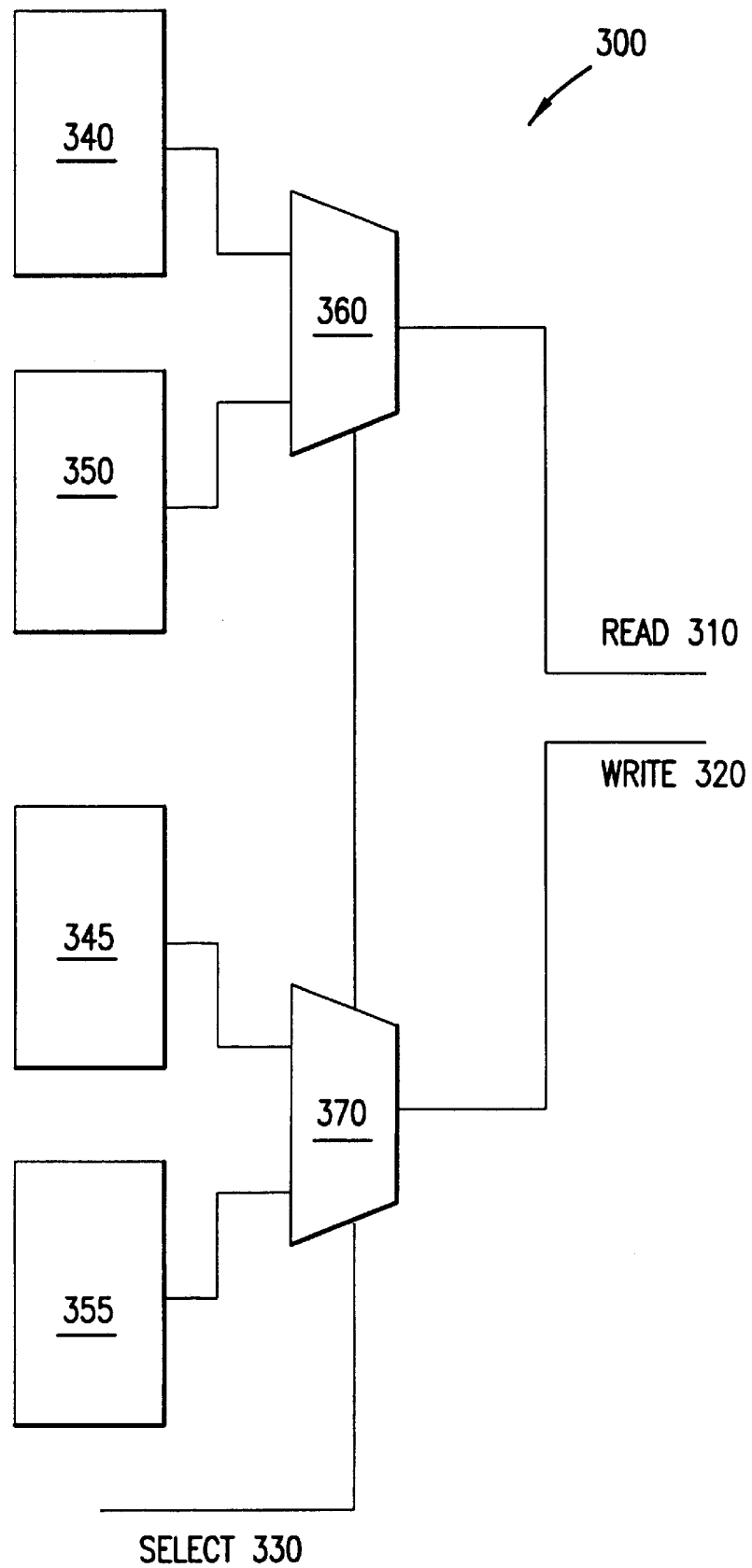
FIG. 3 shows one embodiment of a circuit used by controller 210 to reduce the timing parameters of memory device 220.

FIG. 3 shows one embodiment of a circuit used by controller 210 to reduce the timing parameters of memory device 220. In particular, circuit 300 is coupled to circuit 215 and includes four registers (340–355), two select circuits (360 and 370), input select 330, output read 310, and output write 320. As illustrated in FIG. 3, registers 340 and 350 are coupled to select circuit 360. The output of select circuit 360 is coupled to read 310. Similarly, registers 345 and 355 are coupled to select circuit 370. The output of select circuit 370 is coupled to write 320. Both select circuits 360 and 370 are coupled to select signal 330.

For one embodiment, read 310 is used to determine the delays of controller 210 between successive reads from memory device 210. Similarly, write 320 is used to determine the delays of controller 210 between successive writes to memory device 210. In the present embodiment, during the initialization of system 200, memory device 220 loads normal operation read/write delays into registers 340 and 345, respectively. Subsequently, to vary system 200 timing parameters controller 210 uses delays stored in registers 350 and 355. In particular, during normal operation controller 210 moves select signal 330 to a first position. If select 330 is in a first position, register 340 is coupled to read 310 and register 345 is coupled to write 320. As previously described, registers 340 and 345 increase delays used during normal operation. Accordingly, during normal operation outputs read 310 and write 310 generate the data stored in register 340 and 345. For example, from the initialization process register 340 holds the value four and register 345 holds the value six. Thus, during normal operation controller 210 waits four cycles between successive reads of memory device 220. Additionally, during normal operation controller 210 waits six cycles between successive writes to memory device 220.

If circuit 216 exceeds a threshold value, however, controller 210 moves select 330 to a second position. When select 330 is in a second position, register 350 is coupled to read 310 and register 355 is coupled to write 320. Registers 340 and 345 include delays used during thermal regulation. In contrast to the values stored in registers 340 and 345, registers 350 and 355 hold higher values. For one embodiment, the values stored in registers 350 and 355 are derived from empirical data. For example, based on empirical data register 340 stores the value twelve and register 345 stores the value eighteen. Accordingly, during thermal regulation controller 210 waits twelve cycles between successive reads of memory device 220. Additionally, during thermal regulation controller 210 waits eighteen cycles between successive writes to memory device 220. Regulating the timing parameter of system 200 allows controller 210 to control the operational temperature of memory device 210, thus ensuring that memory device 210 does not exceed $Tj_{,max}$.

To ensure that memory device 220 operates below $Tj_{,max}$ system 200 can also change the operation mode of memory device 220. For example, for one embodiment, memory device 220 has two operational modes. The operational modes include normal operation and low power modes. One low power mode, called a drowsy mode, reduces power dissipation by reducing performance, while another low power mode, called nap, reduces power dissipation by preventing memory access. During low power mode, system 200 consumes less power. In particular, during low power mode memory device 220 turns off non-essential circuitry. The reduction in the power consumption of memory device 220 translates to a reduction in the operating temperature of memory device 220. For one embodiment, if circuit 216 indicates a value above a given threshold, then controller 210 places memory device 220 in a low power mode.

As previously described, placing memory device 220 in a low power mode reduces the thermal dissipation of memory device. The low power modes, however, reduce the performance of system 200. In particular, during the low power modes memory device 220 disables unnecessary circuitry. For one embodiment, controller 210 places memory device 220 in a low power mode for a predetermined time.

The aforementioned regulation schemes helps to ensure that the temperature of memory device 220 does not exceed $Tj_{,max}$. For one embodiment, memory device 210 comprises a dynamic memory device. A regulation scheme that allows memory device 220 to operate above $Tj_{,max}$ is possible. In particular, if circuit 216 indicates a count value above a given threshold, then the regulation scheme requires that controller 210 increases the refresh rate of memory device 220. The increased refresh rate allows memory device 220 to store information that would typically be lost at temperatures above $Tj_{,max}$, thereby effectively increasing $Tj_{,max}$. The increased refresh rate can also reduce temperature by decreasing the time a device is available to perform new operations.

Figure 4:
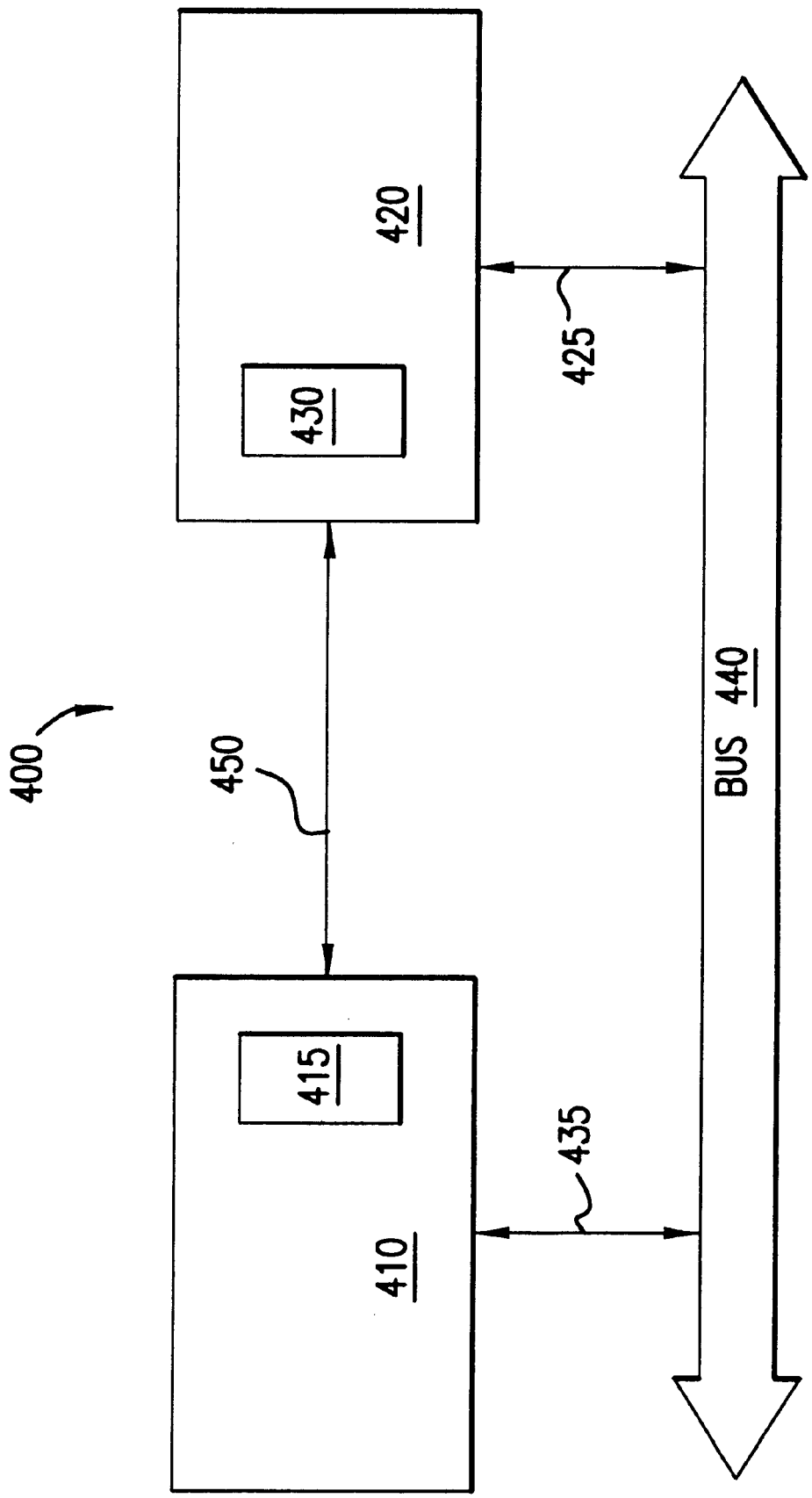
FIG. 4 shows one embodiment of a memory device with a temperature sensing circuit coupled to a memory controller.

FIG. 4 shows one embodiment of a memory device with a temperature sensing circuit coupled to a memory controller. In particular, system 400 includes controller 410 coupled to bus 440 along line 435. Bus 440, in turn, is coupled to memory device 420 via line 425. For one embodiment, bus 440 transmits address and data between controller 410 and memory device 420. Accordingly, using bus 440, controller 410 reads/writes data directly from memory device 420.

As illustrated in FIG. 4, controller 410 includes register 415 and memory device 420 includes circuit 430. Circuit 430 is a temperature sensing circuit that is coupled to register 415 via line 450. Controller 410 uses circuit 430 to determine the operating temperature of memory device 420. In particular, if memory device 420 is operating above a threshold temperature, then circuit 430 generates a digital signal along line 450. For one embodiment, circuit 430 generates a logic "1" to indicate that memory device 420 is operating above a threshold temperature. The logic "1" signal sets a temperature flag in register 415. Based on the set temperature flag, controller 410 initiates a regulation scheme to throttle the operation of system 400, thus reducing the temperature of memory device 420.

Controller 410 periodically samples register 415 to determine whether the temperature flag is set. For one embodiment, the sampling period is derived from empirical data. In particular, the time period between memory device 420 reaching a threshold temperature and memory device 420 reaching $Tj_{,max}$ is empirically ascertained. The sampling period is set to a value that is less than the sum of the empirically derived time and the time required to initiate regulation. Setting the sampling period to such a value ensures that controller 410 initiates a regulation scheme prior to memory device 420 surpassing $Tj_{,max}$. For another embodiment, memory device 420 loads the sampling period of the memory device into controller 410 during the initialization of system 400.

For illustrative purposes, the previous description describes a digital signal generated by circuit 430 along line 450. For one embodiment, however, circuit 430 is a temperature sensitive diode that generates an analog signal. For an alternative embodiment, the output of circuit 430 is transmitted along bus 440.

Figure 5A:
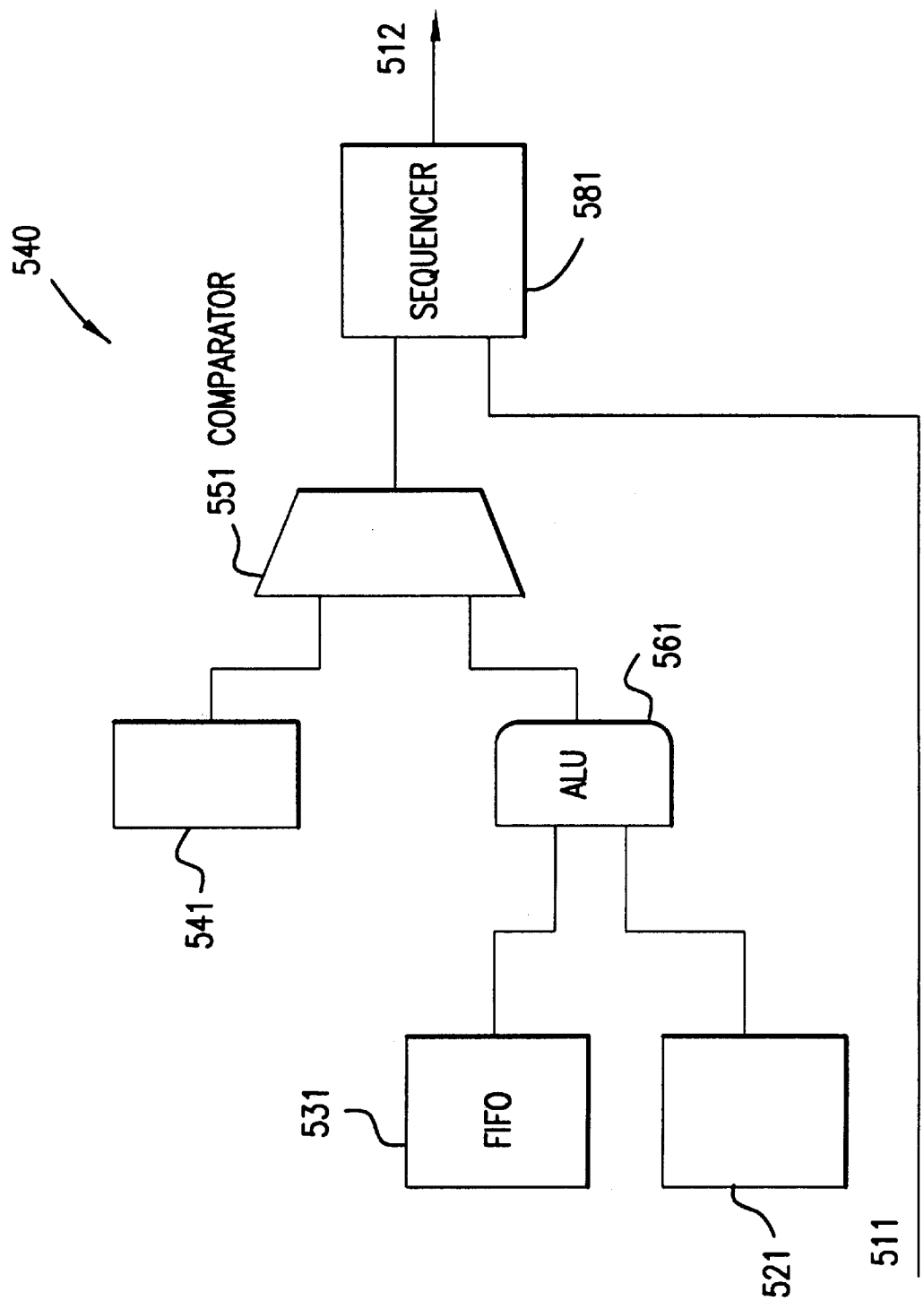
FIG. 5a shows one embodiment of a thermal regulation circuit.

FIG. 5a shows one embodiment of a thermal regulation circuit included in circuit 215. In particular, circuit 590 includes input 511, output 512, register set 541, and sequencer 581. Circuit 590 also includes, FIFO 531 register set 521, comparator 551, and arithmetic logic unit ("ALU") 561. As illustrated in FIG. 5a, sequencer 581 is coupled to input 511 and output 512. For one embodiment, during normal operation, instructions from controller 210 to memory device 220 are transmitted along input 511 through sequencer 581 and onto output 512. During thermal regulation, however, sequencer 581 modifies the instruction sequence transmitted to memory device 220. For example, for one embodiment, sequencer 581 can introduce delay during thermal regulation.

As further illustrated in FIG. 5a, register set 521 and FIFO 531 are coupled to the inputs of ALU 561. The output of ALU 561 is coupled to the first input of comparator 551. The second input of comparator 551 is coupled to register set 541. The output of comparator 551 is coupled to sequencer 581.

For one embodiment, circuit 590 uses FIFO 531, register set 521, register set 541, comparator 551, and ALU 561 to determine whether the thermal regulation of memory device 220 is necessary. In particular, register set 521 includes power parameters of memory device 220. For one embodiment, the power parameters are empirically derived. As previously described, FIFO 531 includes counter information of the operations performed by memory device 220. Using the counter information of FIFO 531 and the thermal parameters of register set 521, ALU 561 performs arithmetic calculations to estimate the operating temperature of memory device 220. After ALU 561 performs the temperature estimation, comparator 551 compares the estimated temperature versus the contents of register set 541. For one embodiment, register set 541 includes empirically derived threshold temperatures.

If the comparison between the estimated temperature and the threshold temperatures shows that thermal regulation is necessary, sequencer 581 initiates a regulation scheme. For example, for one embodiment, the regulation scheme consists of increasing the refresh rate of memory device 220. For an alternative embodiment, regulating the operation of the memory system consists of dynamically changing the timing parameters of memory system 200. For another embodiment, regulating the operation of the memory system consists of dynamically placing memory device 220 in a low power mode. For yet another embodiment, regulating the operation of the memory system consists of dynamically enabling a cooling system. For another embodiment, regulating the operation of the memory system consist of introducing delays between operations.

Figure 5B:
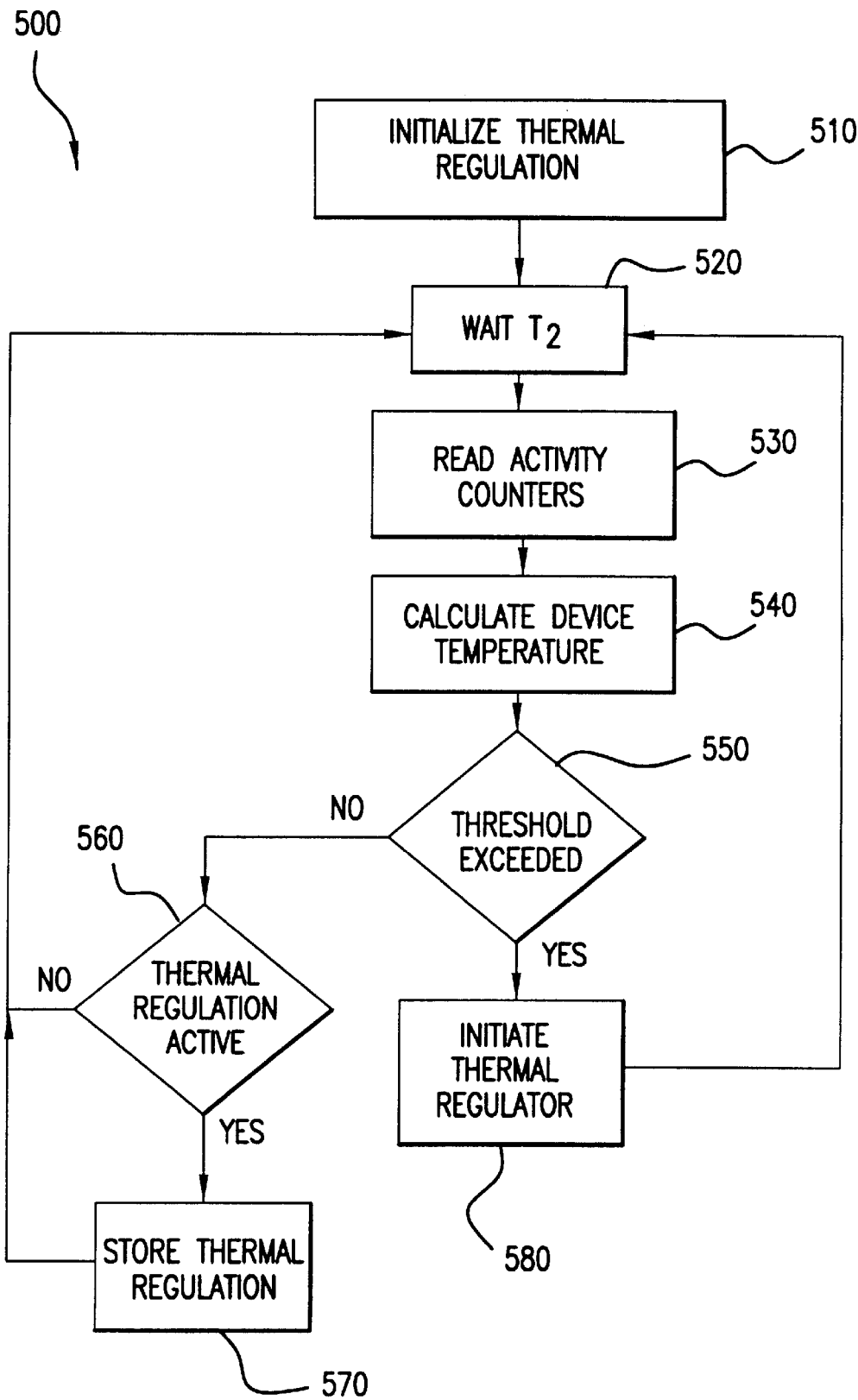
FIG. 5b shows one embodiment of a flowchart for implementing thermal regulation.

FIG. 5b shows one embodiment of a flowchart used by a thermal regulation circuit to implement a thermal regulation scheme. In particular, flowchart 500 shows the steps followed by circuit 590 during the thermal regulation of memory device 220. Using steps 510 through 580, circuit 590 ensures that memory device 220 does not exceed $Tj_{max}$. Step 510 is the initial step in flowchart 500.

For one embodiment, step 510 occurs after the power up of system 200. In step 510, circuit 590 initializes the thermal regulation scheme. In particular, in step 510, circuit 590 resets the counters of FIFO 531. Further, in step 510, circuit 590 reads the timing parameters and threshold values of memory device 220 into register set 521 and register set 521. After the initialization of the regulation scheme, step 520 is begun.

In step 520, circuit 590 waits a "t2" time period to read the counter values in FIFO 531. For one embodiment, "t2" equals the predetermined time period necessary to acquire data for one stage of FIFO buffer 260 included in circuit 216. For an alternative embodiment, "t2" is read by memory controller 510 during the initialization stage described in step 510. After circuit 590 waits "t2" seconds step 530 is begun.

In step 530, circuit 590 reads the counter information in FIFO 531. Subsequently, in step 540, the operating temperature of memory device 220 is calculated via ALU 561. As previously described, for one embodiment, the FIFO counter information is used to compute an estimate of the operating temperature of memory device 220. For an alternative embodiment, a memory device with a temperature sensing circuit is used in system 200 for example, memory device 420 and circuit 430 of system 400. In particular, if memory device 420 is operating above a threshold temperature, then the output of circuit 430 activates a temperature flag in sequencer 581. In step 540, the temperature flag is evaluated to determine the operating temperature of the memory device 220. After calculating/evaluating the operating temperature of the memory device 220, step 550 is begun.

In step 550, the ALU 561 estimated temperature of memory device 220 is compared against a threshold value. For one embodiment, provided the calculated temperature of memory device 220 exceeds the threshold value, flowchart 500 transitions to step 580. In step 580, a thermal regulation scheme is initiated. As previously described, the thermal regulation scheme reduces the operating temperature of memory device 220. For an alternative embodiment, the calculated temperature of memory device 220 is compared against multiple thresholds. The multiple thresholds allow system 200 to initiate a different regulation scheme for each threshold. In particular, provided a first threshold is exceed, flowchart 500 transitions to step 580 to initiate a regulation scheme corresponding to the first threshold. If a second threshold is exceed, then flowchart 500 transitions to step 580 to initiate a second regulation scheme corresponding to the second threshold. Accordingly, the use of different regulation schemes allow system 200 to perform graduated steps to reduce the operating temperature of memory device 220. The gradated steps allow system 200 to balance temperature control versus system performance. After starting a thermal regulation scheme, flowchart 500 returns to step 520.

If the calculated temperature of memory device 220 does not exceed a threshold value, step 560 is begun. In step 560, circuit 590 determines whether a thermal regulation scheme is active. If all thermal regulation schemes are inactive, flowchart 500 transitions to step 520. If a thermal regulation scheme is active, then flowchart 500 transitions to step 570.

In step 570, for one embodiment, circuit 590 stops an active thermal regulation scheme. Circuit 590 stops the active thermal regulation scheme because the calculated temperature of memory device 220 does not exceed a threshold value. Accordingly, the operating temperature of memory device 220 is not approaching $Tj_{max}$ and the active regulation scheme is unnecessary. For an alternative embodiment, in step 570, if the regulation scheme involves multiple threshold values, one or more regulations mechanisms is deactivated depending on which threshold values are exceeded. After step 570, flowchart 500 returns to step 520.

Figure 6:
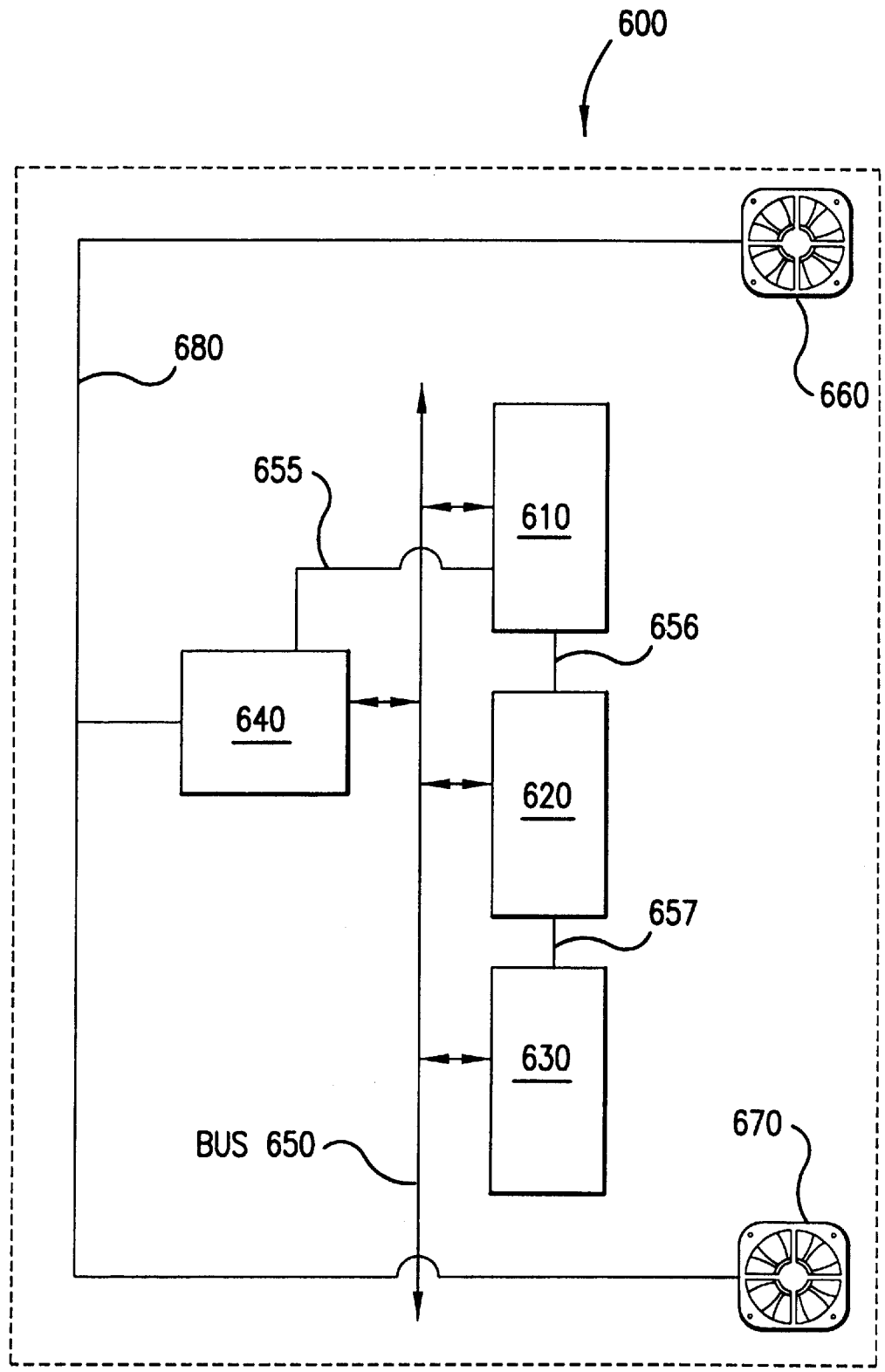
FIG. 6 shows one embodiment of a memory system using thermal regulation circuitry.

FIG. 6 shows one embodiment of a memory system. In particular, system 600 includes controller 640 coupled to memory devices 610, 620, and 630 via bus 650. For one embodiment, bus 650 transmits address and data between controller 640 and memory device 610, 620, and 630. Accordingly, using bus 650 controller 640 reads/writes data directly from the memory devices.

Memory devices 610, 620, and 630 and controller 640 are also coupled to each other via signal lines 655–657. The signal lines form a chain between controller 640 and the memory devices. In particular, memory device 630 is coupled to memory device 620 via signal line 657. Similarly, memory device 620 is coupled to memory device 610 via signal line 656. Finally, memory device 610 is coupled to controller 640 via signal line 655. For one embodiment, during the initialization of system 600 signal lines 655–657 transfer the timing parameters and refresh rates of the memory devices to controller 640.

For one embodiment, controller 640 estimates the memory device operating temperature. As previously described, based on the estimated operating temperature controller 640 initiates a regulation scheme. The regulation scheme reduces the operating temperature of the memory device(s) operating above a threshold temperature. For an alternative embodiment, memory devices 610, 620, and 630 include temperature sensing circuits. Thus, controller 640 determines the actual operating temperature of each memory device. In particular, each temperature sensing circuit outputs a digital signal indicating whether the memory device corresponding to the sensing circuit is operating above a threshold temperature. For one embodiment, signal lines 655–657 transfer the digital signals to controller 640. Based on the digital signals, controller 640 initiates a regulation scheme to reduce the temperature of those memory devices operating above a threshold temperature. For an alternative embodiment, the digital signals are transferred to controller 640 via bus 650.

Controller 640 is also coupled to a cooling system (660 and 670) via line 680. For one embodiment, a regulation scheme implemented by controller 640 includes initiating a cooling system. Accordingly, controller 640 activates fan 660 and fan 670 when the controller determines that one of the memory devices 610, 620, or 630 is approaching $Tj_{max}$.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A memory system comprising:
   a memory controller coupled to a bus;
   a memory device coupled to the bus, the memory device operable to receive data from the bus during a write operation and to transmit data onto the bus during a read operation;

wherein the memory controller comprises:

a tracking circuit operable to track a number of memory device operations during a period of time, the memory device operations including at least one of write operations and read operations; and a control circuit operable to manipulate operation of the memory system in response to a comparison of the number of memory operations and a reference.

2. The memory system of claim 1, wherein the tracking circuit comprises at least one counter.

3. The memory system of claim 2, wherein the at least one counter comprises:

a first counter incremented by each read operation during the period of time; and a second counter incremented by each write operation during the period of time.

4. The memory system of claim 3, wherein the at least one counter comprises a First-In-First-Out (FIFO) buffer.

5. The memory system of claim 1, wherein the reference comprises data relating a number of memory device operations with an estimated operating temperature for the memory device.

6. The memory system of claim 5, wherein the memory controller further comprises:

a delay circuit operable to select a first delay between successive read operations and to select a second delay between successive write operations, on the basis of a control circuit comparison indicating that the number of memory operations exceeds the reference.

7. The memory system of claim 5, wherein the memory device is operable in first and second modes of operation, the memory device consuming less power in the second mode of operation as compared with the first mode of operation; and wherein the memory controller is operable to select between the first and second modes of operation for the memory device on the basis of the control circuit comparison.

8. A method of regulating the operating temperature of a memory device in a memory system comprising the memory device and a memory controller, the method comprising:

determining a number of operations involving the memory device during a time period;

comparing the number of operations to reference data corresponding to an estimated operating temperature for the memory device;

determining whether to manipulate the operation of the memory system on the basis of the comparison between the number of operations and the reference data.

9. The method of claim 8, wherein the number of operations comprises at least one of a number of read operations involving the memory device, a number of write operations involving the memory device, and a number of refresh operations involving the memory device.

10. The method of claim 8, further comprising:

upon determining to manipulate the operation of the memory system, introducing delays between successive read operations and successive write operations.

11. The method of claim 8, further comprising:

upon determining to manipulate the operation of the memory system, placing the memory device in a mode of operation requiring less power.

12. The method of claim 8, further comprising:

upon determining to manipulate the operation of the memory system, increasing the refresh rate for the memory device.

13. A memory system comprising:

a memory controller coupled to a bus;

a memory device coupled to the bus and having a maximum operating temperature;

a temperature sensor measuring an actual operating temperature for the memory device;

a circuit periodically refreshing data in the memory device at a first rate when the actual operating temperature is below the maximum operating temperature, and at a second rate, higher than the first rate, when the actual operating temperature is above the maximum operating temperature.

14. The memory system of claim 13, wherein the temperature sensor generates temperature data communicated to the memory controller via the bus.

15. The memory system of claim 13, wherein the temperature sensor generates temperature data, and wherein the memory system further comprises:

a signal line connecting the temperature sensor and the memory controller, such that the temperature data is communicated to the memory controller via the signal line.

16. The memory system of claim 15, wherein the temperature data comprises a digital flag and wherein the memory controller further comprises:

a data register connected to the signal line and storing a value associated with the digital flag.

17. A memory comprising:

a memory device coupled to a bus, the memory device being operable in a first power mode and a second power mode and having a maximum operating temperature;

a temperature sensor measuring an actual operating temperature for the memory device;

a memory controller coupled to the bus, the memory controller selecting the first power mode for the memory device when the actual operating temperature is below the maximum operating temperature, and selecting the second power mode for the memory device when the actual operating temperature is above the maximum operating temperature;

wherein the memory device consumes less power in the second power mode than in the first power mode.

18. The memory system of claim 17, wherein the temperature sensor generates temperature data communicated to the memory controller via the bus.

19. The memory system of claim 17, wherein the temperature sensor generates temperature data, and wherein the memory system further comprises:

a signal line connecting the temperature sensor and the memory controller, such that the temperature data is communicated to the memory controller via the signal line.

20. The memory system of claim 19, wherein the temperature data comprises a digital flag and wherein the memory controller further comprises:

a data register connected to the signal line and storing a value associated with the digital flag.

* * * * *